US012571100B2

(12) United States Patent (10) Patent No.: US 12,571,100 B2

Knisley et al. (45) Date of Patent: Mar. 10, 2026

(54) ATOMIC LAYER DEPOSITION OF MOLYBDENUM SILICIDE THIN FILMS

(71) Applicants: Applied Materials, Inc., Santa Clara, CA (US); Wayne State University, Detroit, MI (US)

(72) Inventors: Thomas Joseph Knisley, Livonia, MI (US); Daniel Wei Ming Beh, Detroit, MI (US); Zachary J. Devereaux, Webberville, MI (US); Avgerinos V. Gelatos, Scotts Valley, CA (US); Jeffrey W. Anthis, Redwood City, CA (US); Charles H. Winter, Bloomfield Hills, MI (US)

(73) Assignees: Applied Materials, Inc., Santa Clara, CA (US); Wayne State University, Detroit, MI (US)

( * ) Notice: Subject to any disclaimer, the term of this patent is extended or adjusted under 35 U.S.C. 154(b) by 0 days.

(21) Appl. No.: 18/654,703

(22) Filed: May 3, 2024

(65) Prior Publication Data

US 2025/0340986 A1     Nov. 6, 2025

(51) Int. Cl.
*C23C 16/455*     (2006.01)
*C23C 16/42*     (2006.01)
*C23C 16/44*     (2006.01)

(52) U.S. Cl.
CPC ........ *C23C 16/45553* (2013.01); *C23C 16/42* (2013.01); *C23C 16/4408* (2013.01)

(58) Field of Classification Search
CPC .............. C23C 16/45553; C23C 16/42; C23C 16/4408
See application file for complete search history.

(56) References Cited

U.S. PATENT DOCUMENTS

| | | | |
|---|---|---|---|
| 10,995,405 B2 | 5/2021 | Dezelah et al. | |
| 2019/0067094 A1* | 2/2019 | Zope ................. | C23C 16/45525 |
| 2019/0103278 A1 | 4/2019 | Hung et al. | |
| 2022/0359532 A1 | 11/2022 | Yang et al. | |

FOREIGN PATENT DOCUMENTS

| | | |
|---|---|---|
| JP | 2022524041 A | 4/2022 |
| WO | 2023114648 A1 | 6/2023 |
| WO | 2024091543 A1 | 5/2024 |

OTHER PUBLICATIONS

Banerjee, Archan , et al., "Characterisation of amorphous molybdenum silicide (MoSi) superconducting thin films and nanowires", Supercond. Sci. Technol. 30 (2017) 084010 (11pp).

(Continued)

*Primary Examiner* — Michael G Miller

(74) *Attorney, Agent, or Firm* — Servilla Whitney LLC

(57) ABSTRACT

Methods for depositing molybdenum silicide films on a substrate are described. The substrate is exposed to a molybdenum- and silicon-containing precursor and a silane reactant to form the molybdenum silicide film. The exposures can be sequential or simultaneous. Inherent deposition selectivity of the process can be achieved through adjusting process parameters, particularly temperature or precursor dose, to produce more deposition on a metal material over a dielectric material.

20 Claims, 2 Drawing Sheets

100

PRE-TREAT SUBSTRATE ⌐ 105

EXPOSE SUBSTRATE TO MOLYBDENUM PRECURSOR ⌐ 112

⌐ 110

PURGE ⌐ 114

EXPOSE SUBSTRATE TO REACTANT ⌐ 116

PURGE ⌐ 118

THICKNESS / CYCLES REACHED? ⌐ 120

NO

YES

POST-PROCESSING ⌐ 130

(56) References Cited

OTHER PUBLICATIONS

Juppo, Marika , et al., "Deposition of molybdenum thin films by an alternate supply of MoCl 5 and Zn", Journal of Vacuum Science & Technology A 16, 2845 (1998); doi: 0.1116/1.581430.

Lee, Baek-Ju , et al., "Study on the Deposition Characteristics of Molybdenum Thin Films Deposited by the Thermal Atomic Layer Deposition Method Using MoO2Cl2 as a Precursor", Coatings 2023, 13, 1070, 14 pages.

Lopez-Pinto, Nicolau , et al., "Deposition and characterisation of sputtered molybdenum oxide thin films with hydrogen atmosphere", Applied Surface Science 563 (2021) 150285, 8 pages.

Mattinen, M. , et al., "Atomic layer deposition of crystalline molybdenum oxide thin films and phase control by post-deposition annealing", Materials Today Chemistry, 2018, vol. 9, pp. 17-27.

"PCT International Search Report and Written Opinion in PCT/US2025/026315 dated Aug. 14, 2025, 12 pages".

* cited by examiner

ATOMIC LAYER DEPOSITION OF MOLYBDENUM SILICIDE THIN FILMS

TECHNICAL FIELD

Embodiments of the present disclosure generally relate to methods for depositing molybdenum silicide thin films. In particular, embodiments of the disclosure are directed to methods of selectively depositing molybdenum silicide thin films by atomic layer deposition.

BACKGROUND

Deposition of thin films on a substrate surface is an important process in a variety of industries including semiconductor processing, diffusion barrier coatings, and dielectrics for magnetic read/write heads. In the semiconductor industry, in particular, miniaturization requires atomic level control of thin film deposition to produce conformal coatings on high aspect structures.

As microelectronic device sizes become smaller, challenges exist with current films used for contacts, barrier layers, etc. There are several applications in front end of the line (FEOL) applications where silicide films are desirable. One drawback is that most processes produce silicide films by consuming silicon that is already present in the structural material. As transistor feature sizes shrink, this consumption of the structural material becomes troublesome, as silicon is becoming scarce and often leads to undesirable electrical performance shifts because silicon is being brought into the process.

Accordingly, there is a need in the art for new methods of depositing molybdenum silicide films for microelectronic devices.

SUMMARY

One or more embodiments of the disclosure are directed to methods of depositing a film. In one or more embodiments, a method of depositing a film comprises: exposing a semiconductor substrate surface to a molybdenum- and silicon-containing precursor in a processing chamber to deposit a film on the semiconductor substrate surface, the semiconductor substrate surface comprising at least one feature having at least one opening having a width, at least one sidewall, and a bottom, the at least one feature extending a feature depth from a top surface to the bottom, the bottom comprising a metal material and the at least one sidewall comprising a dielectric material; purging the processing chamber of the molybdenum- and silicon-containing precursor; exposing the semiconductor substrate surface to a silane reactant to react with the film to form a molybdenum silicide film on the bottom of the semiconductor substrate surface; and purging the processing chamber of the silane reactant.

Additional embodiments of the disclosure are directed to methods of depositing a film. In one or more embodiments, a method of depositing a film comprises: selectively forming a molybdenum silicide film in a process cycle comprising sequential exposure of a semiconductor substrate surface to a molybdenum- and silicon-containing precursor, purge gas, silane reactant, and purge gas, the semiconductor substrate surface comprising at least one feature having at least one opening having a width, at least one sidewall, and a bottom, the at least one feature extending a feature depth from a top surface to the bottom, the bottom comprising a metal material and the at least one sidewall comprising a dielectric material.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

DETAILED DESCRIPTION

Figure 1:
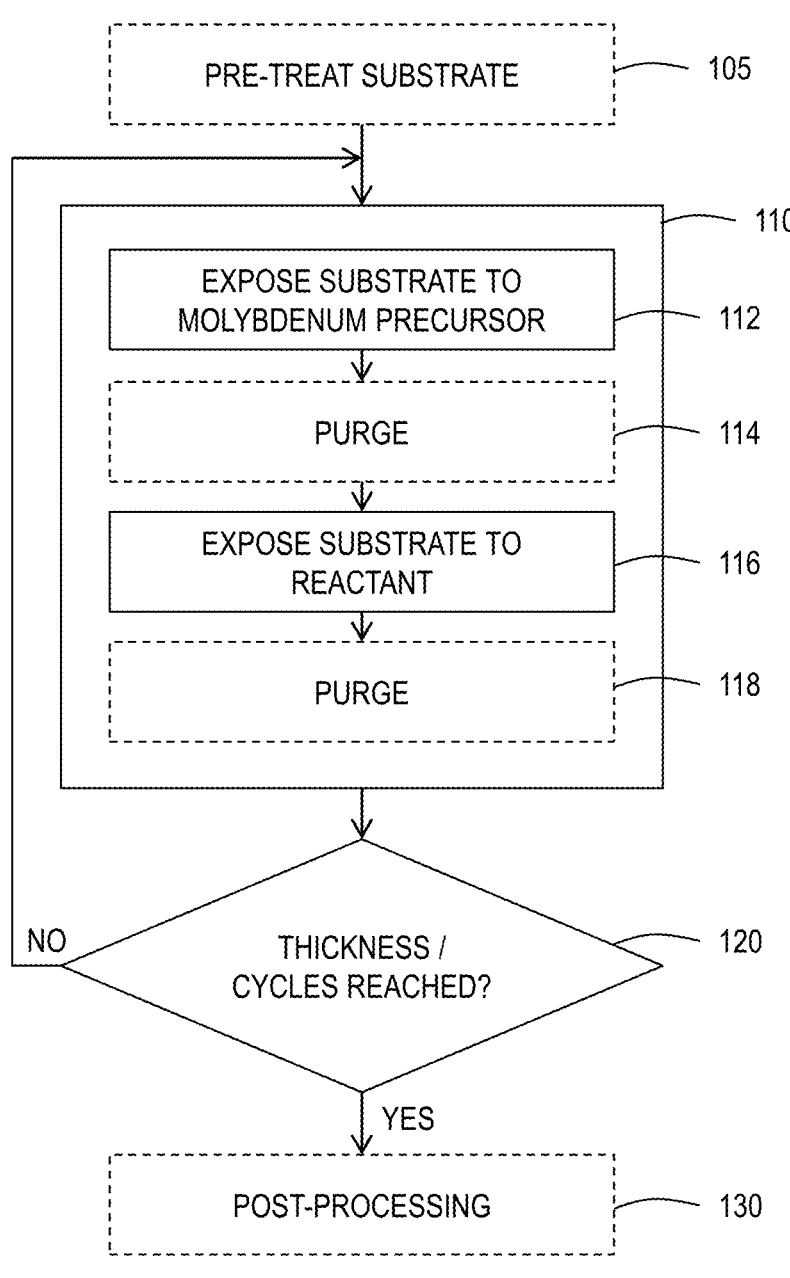
FIG. 1 illustrates a flowchart of a processing method in accordance with one or more embodiments of the disclosure.

Before describing several exemplary embodiments of the invention, it is to be understood that the invention is not limited to the details of construction or process steps set forth in the following description. The invention is capable of other embodiments and of being practiced or being carried out in various ways.

A "substrate" as used herein, refers to any substrate or material surface formed on a substrate upon which film processing is performed during a fabrication process. For example, a substrate surface on which processing can be performed include materials such as silicon, silicon oxide, strained silicon, silicon on insulator (SOI), carbon doped silicon oxides, amorphous silicon, doped silicon, germanium, gallium arsenide, glass, sapphire, and any other materials such as metals, metal nitrides, metal alloys, and other conductive materials, depending on the application. Substrates include, without limitation, semiconductor wafers. Substrates may be exposed to a pretreatment process to polish, etch, reduce, oxidize, hydroxylate, anneal and/or bake the substrate surface. In addition to film processing directly on the surface of the substrate itself, in the present invention, any of the film processing steps disclosed may also be performed on an underlayer formed on the substrate as disclosed in more detail below, and the term "substrate surface" is intended to include such underlayer as the context indicates. Thus, for example, where a film/layer or partial film/layer has been deposited onto a substrate surface, the exposed surface of the newly deposited film/layer becomes the substrate surface.

According to one or more embodiments, the method uses an atomic layer deposition (ALD) process. In such embodiments, the substrate surface is exposed to the precursors (or reactive gases) sequentially or substantially sequentially. As used herein throughout the specification, "substantially sequentially" means that a majority of the duration of a precursor exposure does not overlap with the exposure to a co-reagent, although there may be some overlap. As used in this specification and the appended claims, the terms "precursor", "silane reactant", "reactive gas" and the like are used interchangeably to refer to any gaseous species that can react with the substrate surface.

In one or more embodiments, the molybdenum- and silicon-containing precursors are provided that advantageously have high thermal stability, allowing one to facilitate a broader range of process temperatures for ALD. In one or more embodiments, deposition of molybdenum silicide ($MoSi_x$) thin films on semiconductor substrate surfaces, including but not limited to silicon oxide ($SiO_2$), tungsten (W), ruthenium (Ru), and the like by ALD was achieved with a molybdenum halide precursor and a silane reactant. In one or more embodiments, selective deposition on semiconductor substrate surfaces can be achieved by tuning the substrate temperature and pulse length of the molybdenum- and silicon-containing precursor and silane reactant. In other non-illustrated embodiments, it should be known to those knowledgeable and skilled in the art that selective deposition on semiconductor substrate surfaces can also be achieved through the use of small molecule inhibitor or surface-assembled monolayer blocking molecules. The thermal volatility properties of the molybdenum halide precursor were assessed by thermogravimetric analysis (TGA) and growth behavior was studied by scanning electron microscopy (SEM), X-ray fluorescence spectroscopy (XRF), and transmission electron microscopy (TEM). In one or more embodiments, the composition of these molybdenum silicide films was studied by X-ray photoelectron spectroscopy (XPS), XRF, and electron energy loss spectroscopy (EELS).

One or more embodiments of the disclosure advantageously provide processes for atomic layer deposition to form molybdenum silicide films. As used in this specification and the appended claims, the term "molybdenum silicide film" refers to a film that comprises molybdenum atoms and has greater than or equal to about 1 atomic % molybdenum, greater than or equal to about 2 atomic % molybdenum, greater than or equal to about 3 atomic % molybdenum, greater than or equal to about 4 atomic % molybdenum, greater than or equal to about 5 atomic % molybdenum, greater than or equal to about 10 atomic % molybdenum, greater than or equal to about 15 atomic % molybdenum, greater than or equal to about 20 atomic % molybdenum, greater than or equal to about 25 atomic % molybdenum, greater than or equal to about 30 atomic % molybdenum, greater than or equal to about 35 atomic % molybdenum, greater than or equal to about 40 atomic % molybdenum, greater than or equal to about 45 atomic % molybdenum, greater than or equal to about 50 atomic % molybdenum, greater than or equal to about 60 atomic % molybdenum, greater than or equal to about 70 atomic % molybdenum, greater than or equal to about 80 atomic % molybdenum, or greater than or equal to about 90 atomic % molybdenum. In some embodiments, the film comprises molybdenum silicide ($MoSi_x$). The skilled artisan will recognize that the use of molecular formulas like $MoSi_x$ does not imply a specific stoichiometric relationship between the elements but merely the identity of the major components of the film. For example, $MoSi_x$ refers to a film whose major composition comprises molybdenum and silicon atoms. In some embodiments, the major composition of the specified film (i.e., the sum of the atomic percents of the specified atoms) is greater than or equal to about 50%, 70%, 80%, 90%, 95%, 98%, 99% or 99.5% of the film, on an atomic basis.

With reference to FIG. 1, one or more embodiments of the disclosure are directed to method 100 of depositing a thin film. The method illustrated in FIG. 1 is representative of an atomic layer deposition (ALD) process in which the substrate or substrate surface is exposed sequentially to the reactive gases in a manner that prevents or minimizes gas phase reactions of the reactive gases. In some non-illustrated embodiments, the method comprises a chemical vapor deposition (CVD) process in which the reactive gases are mixed in the processing chamber to allow gas phase reactions of the reactive gases and deposition of the thin film.

In some embodiments, the method 100 includes a pre-treatment operation 105. The pre-treatment can be any suitable pre-treatment known to the skilled artisan. Suitable pre-treatments include, but are not limited to, pre-heating, cleaning, soaking, native oxide removal, or deposition of an adhesion layer (e.g., titanium nitride (TiN)). In one or more embodiments, an adhesion layer, such as titanium nitride, is deposited at operation 105.

At deposition 110, a process is performed to deposit a molybdenum silicide thin film on the substrate (or substrate surface). The deposition process can include one or more operations to form a film on the substrate. In operation 112, the substrate (or substrate surface) is exposed to a molybdenum- and silicon-containing precursor to deposit a film on the substrate (or substrate surface). The molybdenum- and silicon-containing precursor can be any suitable molybdenum silicide compound that can react with (i.e., adsorb or chemisorb onto) the substrate surface to leave a molybdenum silicide species on the substrate surface.

In one or more embodiments, the molybdenum- and silicon-containing precursor comprises a molybdenum halide. In one or more embodiments, the molybdenum halide precursor comprises a compound having the general Formula (I): $MoQ_zR_m$ (I), wherein Mo is molybdenum, Q is a halogen selected from Cl, Br, F, or I, z is from 1 to 6, R is selected from alkyl, CO, cyclopentadienyl, amidinate, diazadiene, or amidate, and m is from 0 to 6.

In one or more embodiments, Q is a halogen selected from Cl, Br, F, or I. In one or more embodiments, z is from 1 to 6, including 1, 2, 3, 4, 5, or 6. In other embodiments, Q is selected from Cl or Br. In a specific embodiment, Q is Cl. In another specific embodiment, Q is Br.

Unless otherwise indicated, the term "lower alkyl," "alkyl," or "alk" as used herein alone or as part of another group includes both straight and branched chain hydrocarbons, containing 1 to 24 carbons, in the normal chain, such as methyl, ethyl, propyl, isopropyl, butyl, t-butyl, isobutyl, pentyl, hexyl, isohexyl, heptyl, 4,4-dimethylpentyl, octyl, 2,2,4-trimethyl-pentyl, nonyl, decyl, undecyl, dodecyl, the various branched chain isomers thereof, and the like. Such groups may optionally include up to 1 to 4 substituents.

As used herein, the term "alkoxy" includes any of the above alkyl groups linked to an oxygen atom.

As used herein, the terms "vinyl" or "vinyl-containing" refer to groups containing the vinyl group ($-CH=CH_2$).

As used herein, the term "amine" relates to any organic compound containing at least one basic nitrogen atom, e.g., $NR's$, wherein R' is independently selected from hydrogen (H) or alkyl.

As used herein, the term "halide" refers to a binary compound, of which one part is a halogen atom and the other part is an element or radical that is less electronegative than the halogen, to make a fluoride, chloride, bromide, iodide, or astatide compound. A halide ion is a halogen atom bearing a negative charge. As known to those of skill in the art, a halide anion includes fluoride (F—), chloride (Cl—), bromide (Br—), and iodide (I—).

In one or more specific embodiments, the molybdenum- and silicon-containing precursor comprises one or more of molybdenum pentachloride ($MoCl_5$), molybdenum pentafluoride (MoF$_5$), molybdenum trichloride (MoCl$_3$), molybdenum tribromide (MoBr$_3$), and molybdenum hexafluoride (MoF$_6$).

The substrate (or substrate surface) can be any suitable surface. Suitable surfaces include, but are not limited to, silicon (Si), silicon dioxide (SiO$_2$), silicon oxide (SiO$_x$), silicon oxycarbide (SiOC), platinum (Pt), titanium nitride (TiN), tantalum nitride (TaN), copper (Cu), cobalt (Cu), tungsten (W), ruthenium (Ru), molybdenum (Mo), amorphous carbon, or combinations thereof.

In one or more embodiments, the substrate (or substrate surface) comprises at least one feature having at least one opening having a width, at least one sidewall, and a bottom. In one or more embodiments, the at least one feature extends a feature depth from a top surface to the bottom, the bottom comprising a metal material and the at least one sidewall comprising a dielectric material.

In one or more embodiments, the dielectric material may comprise any suitable dielectric material known to the skilled artisan. A "dielectric material," as used herein, refers to an electrical insulator material that can be polarized by an applied electric field. Non-limiting examples of dielectric material include silicon oxide (SiO$_x$), silicon nitride (Si$_x$N$_y$), silicon (Si), silicon oxynitride (SiON), carbides, oxycarbides, nitrides, oxynitrides, oxycarbonitrides, polymers, phosphosilicate glass, fluorosilicate (SiOF) glass, organosilicate glass (SiOCH), aluminum oxide (AlO$_x$), hafnium oxide (HfO$_x$), zirconium oxide (ZrO$_2$), titanium oxide (TiO$_x$), titanium nitride (TiN), tantalum oxide (Ta$_x$O$_5$), yttrium oxide (Y$_2$O$_3$), lanthanum oxide (La$_2$O$_3$), aluminum nitride (AlN), magnesium oxide (MgO), calcium fluoride (CaF$_2$), lithium fluoride (LiF), strontium oxide (SrO), barium oxide (BaO), hafnium silicate (HfSiO$_4$), lanthanum aluminate (LaAlO$_3$), niobium pentoxide (Nb$_2$O$_5$), barium titanate (BaTiO$_3$), strontium titanate (SrTiO$_3$), bismuth titanate (Bi$_4$Ti$_3$O$_{12}$), lead zirconium titanate (Pb(Zr, Ti)O$_3$), calcium copper titanate (CaCu$_3$Ti$_4$O$_{12}$), lithium niobate (LiNbO$_3$), barium titanate (BaTiO$_3$), and potassium niobate (KNbO$_3$). In one or more embodiments, the dielectric material comprises one or more of wherein the substrate comprises one or more of silicon (Si), silicon dioxide (SiO$_2$), silicon oxide (SiO$_x$), silicon oxycarbide (SiOC), silicon oxycarbonitride (SiOCN), silicon oxynitride (SiON), silicon carbonitride (SiCN).

In one or more embodiments, the metal material may comprise any suitable metal material known to the skilled artisan. In one or more embodiments, the metal material comprises one or more of platinum (Pt), titanium (Ti), titanium nitride (TiN), tantalum nitride (TaN), copper (Cu), cobalt (Cu), tungsten (W), and ruthenium (Ru). In one or more specific embodiments, the metal material comprises one or more of tungsten (W) and/or ruthenium (Ru).

At operation 114, the processing chamber is purged to remove unreacted molybdenum- and silicon-containing precursor, reaction products, and by-products. As used in this manner, the term "processing chamber" also includes portions of a processing chamber adjacent to the substrate surface without encompassing the complete interior volume of the processing chamber. For example, in a sector of a spatially separated processing chamber, the portion of the processing chamber adjacent the substrate surface is purged of the molybdenum- and silicon-containing precursor by any suitable technique including, but not limited to, moving the substrate through a gas curtain to a portion or sector of the processing chamber that contains none or substantially none of the molybdenum- and silicon-containing precursor. In some embodiments, purging the processing chamber comprises flowing a purge gas over the substrate. In some embodiments, the portion of the processing chamber refers to a micro-volume or small volume process station within a processing chamber. The term "adjacent" referring to the substrate surface means the physical space next to the surface of the substrate which can provide sufficient space for a surface reaction (e.g., precursor adsorption) to occur.

At operation 116, the substrate (or substrate surface) is exposed to a silane reactant to form a molybdenum silicide film on the substrate. The silane reactant can react with the molybdenum species on the substrate surface to form the molybdenum silicide film. In some embodiments, the silane reactant or co-silane reactant comprises one or more of silane (SiH$_4$), disilane (Si$_2$H$_6$), trisilane (Si$_3$H$_8$), and alkyl silane.

As used herein, the term "alkyl silane" refers to saturated compounds that contain one or more silicon atoms linked to each other or one or more atoms of other chemical elements, e.g., carbon.

At operation 118, the processing chamber is purged after exposure to the silane reactant. Purging the processing chamber in operation 118 can be the same process or different process than the purge in operation 114. Purging the processing chamber, portion of the processing chamber, area adjacent the substrate surface, etc., removes unreacted silane reactant, reaction products and by-products from the area adjacent the substrate surface.

At decision 120, the thickness of the deposited molybdenum silicide film, or number of cycles of molybdenum- and silicon-containing precursor and silane reactant is considered. If the deposited molybdenum silicide film has reached a predetermined thickness or a predetermined number of process cycles have been performed, the method 100 moves to an optional post-processing operation 130. If the thickness of the deposited molybdenum silicide film or the number of process cycles has not reached the predetermined threshold, the method 100 returns to operation 110 to expose the substrate surface to the molybdenum- and silicon-containing precursor again in operation 112 and continuing.

The optional post-processing operation 130 can be, for example, a process to modify film properties (e.g., annealing) or a further film deposition process (e.g., additional ALD or CVD processes) to grow additional films. In some embodiments, the optional post-processing operation 130 can be a process that modifies a property of the deposited film. In some embodiments, the optional post-processing operation 130 comprises annealing the as-deposited film. In some embodiments, annealing is done at temperatures in the range of about 300° C., 400° C., 500° C., 600° C., 700° C., 800° C., 900° C. or 1000° C. The annealing environment of some embodiments comprises one or more of an inert gas (e.g., molecular nitrogen (N$_2$), argon (Ar)) or a reducing gas (e.g., molecular hydrogen (H$_2$) or ammonia (NH$_3$)) or an oxidant, such as, but not limited to, oxygen (O$_2$), ozone (O$_3$), or peroxides. Annealing can be performed for any suitable length of time. In some embodiments, the film is annealed for a predetermined time in the range of about 15 seconds to about 90 minutes, or in the range of about 1 minute to about 60 minutes. In some embodiments, annealing the as-deposited film increases the density, decreases the resistivity and/or increases the purity of the film.

The method 100 can be performed at any suitable temperature depending on, for example, the molybdenum- and silicon-containing precursor, silane reactant, or thermal budget of the device. In some embodiments, exposures to the molybdenum- and silicon-containing precursor (operation 112) and the silane reactant (operation 116) occur at the same temperature. In some embodiments, the substrate is maintained at a temperature in a range of about 100° C. to about 500° C., or about 150° C. to about 450° C.

In some embodiments, exposure to the molybdenum- and silicon-containing precursor (operation 112) occurs at a different temperature than the exposure to the silane reactant (operation 116). In some embodiments, the substrate is maintained at a first temperature in a range of about 100° C. to about 550° C., or about 150° C. to about 450° C., for the exposure to the molybdenum- and silicon-containing precursor, and at a second temperature in the range of about 100° C. to about 500° C., or about 150° C. to about 450° C., for exposure the silane reactant.

In the embodiment illustrated in FIG. 1, at deposition operation 110 the substrate (or substrate surface) is exposed to the molybdenum- and silicon-containing precursor and the silane reactant sequentially. In another, un-illustrated, embodiment, the substrate (or substrate surface) is exposed to the molybdenum- and silicon-containing precursor and the silane reactant simultaneously in a CVD reaction. In a CVD reaction, the substrate (or substrate surface) can be exposed to a gaseous mixture of the molybdenum- and silicon-containing precursor and silane reactant to deposit a molybdenum silicide film having a predetermined thickness. In the CVD reaction, the molybdenum silicide film can be deposited in one exposure to the mixed reactive gas or can be multiple exposures to the mixed reactive gas with purges between.

In one or more embodiments, the molybdenum silicide film comprises molybdenum silicide ($MoSi_x$) with a silicon content of greater than or equal to about 5%, 7.5%, 10%, 12.5 or 15%, on an atomic basis. In some embodiments, the molybdenum silicide film comprises a silicon content in the range of about 2% to about 30%, or in the range of about 3% to about 25%, or in the range of about 4% to about 20%, on an atomic basis. In some embodiments, the molybdenum silicide film comprises a silicon content in the range of about 5% to 30%, on an atomic basis. In some embodiments, the molybdenum silicide film comprises a silicon content in the range of about 10% to 50%, on an atomic basis. In some embodiments, the molybdenum silicide film comprises a silicon content in the range of about 20% to 70%, on an atomic basis. In some embodiments, the molybdenum silicide film comprises a silicon content in the range of about 30% to 90%, on an atomic basis.

The deposition operation 110 can be repeated to form a molybdenum silicide film having a predetermined thickness. In some embodiments, the deposition operation 110 is repeated to provide a molybdenum silicide film having a thickness in the range of about 0.3 nm to about 100 nm, or in the range of about 30 Å to about 3000 Å.

One or more embodiments of the disclosure are directed to methods of depositing molybdenum silicide films in high aspect ratio features. A high aspect ratio feature is a trench, via, or pillar having a height:width ratio greater than or equal to about 10, 20, or 50, or more. In some embodiments, the molybdenum silicide film is deposited conformally on the high aspect ratio feature. As used in this manner, a conformal film has a thickness near the top of the feature that is in the range of about 80-120% of the thickness at the bottom of the feature.

Some embodiments of the disclosure are directed to methods for selective deposition in/on a feature. In some embodiments, the feature has a first material at the bottom (e.g., a metal) and a second material (e.g., a dielectric) at the sidewalls. The molybdenum silicide film deposits selectively on the first material relative to the second material so that the molybdenum silicide film fills forms substantially only on the metal material.

Figure 2:
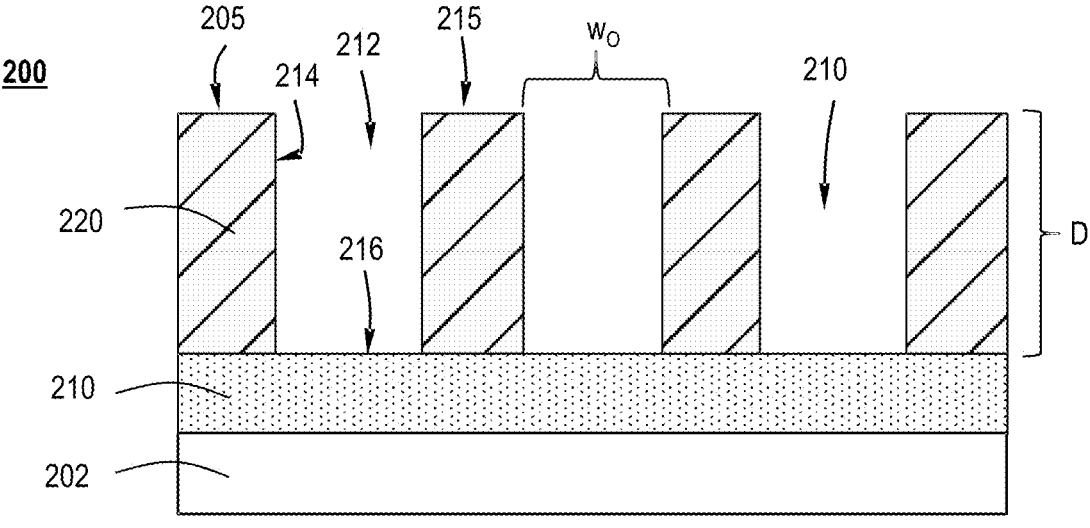
FIG. 2 illustrates a cross-section view of a substrate being processed in accordance with one or more embodiments of the disclosure.

FIG. 2 illustrates a semiconductor device 200 with a substrate surface 205. In one or more embodiments, the substrate surface refers to the exposed surface of the substrate upon which a process may be performed. The substrate surface 205 has at least one feature 210 formed therein. While only three features are shown in the Figures, one skilled in the art will recognize that a plurality of features will each be affected by the disclosed methods in a similar manner.

The at least one feature 210 has an opening 212 with an opening width $w_O$. The opening 212 is formed in a top surface 215 of the device 200. The feature 210 also has one or more sidewall 214 and extends a feature depth D from the top surface 215 to bottom 216. While straight, vertical sidewalls are shown in the Figures, the disclosed methods may also be performed on slanted, irregular, or reentrant sidewalls.

In one or more embodiments, the device 200 illustrated in FIG. 2 is comprised of a first layer 220 on a second layer 210 on a substrate 202. Those skilled in the art will recognize that the top surface 215, sidewall 214, and bottom 216 may each be comprised of one or more similar or different materials. For example, the lower portion of sidewall 214 may be formed from a first material while the upper portion of the same sidewall 214 may be comprised of a second material. Similarly, a thin layer may be deposited on the top surface 215 without forming an appreciable portion of the sidewall 214. In one or more embodiments, the bottom 216 may be comprised of a different material 210 than the sidewall 214.

In one or more embodiments, the opening width $w_O$ of the opening 212 is less than or equal to about 50 nm, less than or equal to about 30 nm, less than or equal to about 20 nm, less than or equal to about 10 nm, or less than or equal to about 7 nm. In one or more embodiments, the opening width $w_O$ is in a range of about 8 nm to about 20 nm.

In one or more embodiments, the feature depth D of the feature 210 is greater than or equal to about 5 nm, greater than or equal to about 10 nm, greater than or equal to about 20 nm, greater than or equal to about 50 nm, greater than or equal to about 60 nm, greater than or equal to about 75 nm, greater than or equal to about 100 nm, greater than or equal to about 200 nm, greater than or equal to about 300 nm, greater than or equal to about 400 nm, or greater than or equal to about 450 nm. In one or more embodiments, the feature depth D is in a range of about 5 nm to about 500 nm.

As used herein, the term "feature" means any intentional surface irregularity. Suitable examples of features include but are not limited to trenches or vias which have a top, two sidewalls and a bottom, peaks which have a top and two sidewalls. Features can have any suitable aspect ratio (ratio of the depth of the feature to the width of the feature). In one or more embodiments, the aspect ratio of the at least one feature 210 is greater than or equal to about 5:1, 10:1, 15:1, 20:1, 25:1, 30:1, 35:1 or 40:1.

Figure 3:
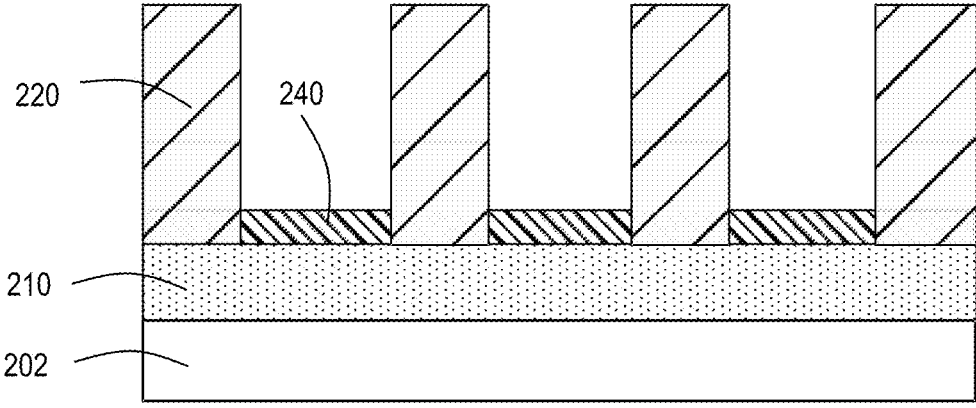
FIG. 3 illustrates a cross-section view of a substrate being processed in accordance with one or more embodiments of the disclosure.

An exemplary device 200 is shown in FIG. 3 after optional operation 105. The device 200 comprises a bottom formed from layer 210 and sidewalls and a top surface formed from layer 220. In one or more embodiments, layer 210 comprises a conductive material, e.g., a metal material, and layer 220 comprises a dielectric material. Those skilled in the art will recognize that the disclosed processes may be performed on different materials and/or that the illustrated layers may be arranged in different ways.

As used herein, the dielectric material may comprise any suitable dielectric material known to the skilled artisan. A "dielectric material," as used herein, refers to an electrical insulator material that can be polarized by an applied electric field. Non-limiting examples of dielectric material include silicon oxide ($SiO_x$), silicon nitride ($Si_xN_y$), silicon (Si), silicon oxynitride (SiON), carbides, oxycarbides, nitrides, oxynitrides, oxycarbonitrides, polymers, phosphosilicate glass, fluorosilicate (SiOF) glass, organosilicate glass (SiOCH), aluminum oxide ($AlO_x$), hafnium oxide ($HfO_x$), zirconium oxide ($ZrO_2$), titanium oxide ($TiO_x$), titanium nitride (TiN), tantalum oxide ($Ta_xO_5$), yttrium oxide ($Y_2O_3$), lanthanum oxide ($La_2O_3$), aluminum nitride (AlN), magnesium oxide (MgO), calcium fluoride ($CaF_2$), lithium fluoride (LiF), strontium oxide (SrO), barium oxide (BaO), hafnium silicate ($HfSiO_4$), lanthanum aluminate ($LaAlO_3$), niobium pentoxide ($Nb_2O_5$), barium titanate ($BaTiO_3$), strontium titanate ($SrTiO_3$), bismuth titanate ($Bi_4Ti_3O_{12}$), lead zirconium titanate ($Pb(Zr, Ti)O_3$), calcium copper titanate ($CaCu_3Ti_4O_{12}$), lithium niobate ($LiNbO_3$), barium titanate ($BaTiO_3$), and potassium niobate ($KNbO_3$). In one or more specific embodiments, the dielectric layer 220 comprises one or more of silicon oxide ($SiO_x$), silicon oxycarbide (SiOC), silicon oxycarbonitride (SiOCN), silicon nitride (SiN), silicon oxynitride (SiON), aluminum oxide ($AlO_x$), aluminum nitride (AlN), and hafnium oxide ($HfO_x$).

With reference to FIG. 1 and FIG. 3, the method 100 continues with deposition operation 110. Deposition operation 110 may be a cycle which forms a layer of molybdenum silicide 240 selectively at the bottom 216 of at least one feature 210 of the device 200. Deposition operation 110 includes a series of operations which are each performed in sequence and may be repeated. Some of the operations may be optional within each cycle. A given optional operation may be performed during each cycle, periodically (every other, every fifth, or every hundredth cycle), as needed based on predetermined parameters, or even not at all.

As illustrated in FIG. 1 and in FIG. 3, the deposition operation 110 begins with operation 112, followed by operations 114, 116, and 118, as described above to selectively deposit a molybdenum silicide film 240 on the metal material of layer 210 of the device 200 over the dielectric material of layer 220. As used in this regard, the term "selectively over" means that the molybdenum silicide film 240 is formed on the metal material of layer 210 of the device to a greater extent than the molybdenum silicide film 240 can be formed on the dielectric material of layer 220 of the device 200. For example, the molybdenum silicide film 240 can be formed on the metal material of layer 210 greater than or equal to 20 times, 30 times, 40 times or 50 times thicker than the film is formed on the dielectric material of layer 220 of the device 200. In one or more embodiments, the selectivity is greater than 2:1, greater than 5:1, greater than 10:1, or greater than 100:1.

The molybdenum silicide film 240 has a thickness on the bottom 216. The molybdenum silicide film 240 may comprise any suitable material known to the skilled artisan, as described above. In some embodiments, the molybdenum silicide film 240 forms on the bottom of the at least one feature. In one or more embodiments, the molybdenum silicide film 240 comprises molybdenum silicide ($MoSi_x$).

While the molybdenum silicide film 240 may be deposited by any suitable method. In one or more embodiments, the molybdenum silicide film 240 is deposited by atomic layer deposition (ALD) according to the method 100 of FIG. 1. In these embodiments, as shown in FIG. 3, the sidewall 214 and top surface 205 are substantially free of molybdenum silicide film 240, while the bottom 216 of the at least one feature 212 comprises the molybdenum silicide film 240. As used in this specification and the appended claims, the term "substantially free of" used in this respect means, as will be understood by those skilled in the art, that there is the possibility that a small portion, e.g., less than 5%, or less than 4%, or less than 3%, or less than 2%, or less than 1%, of the dielectric material 220 may be contain molybdenum silicide film, but such presence is generally unintended.

In one or more embodiments, the molybdenum silicide film 240 is selectively deposited on at least a portion of the bottom 216 of the at least one feature 212. In other embodiments, the molybdenum silicide film 240 does not form on the sidewall 214, such that the sidewall 214 is substantially free of molybdenum silicide film 240. In one or more embodiments, the molybdenum silicide film 240 may cover the entirety of the bottom 216 and the bottom 216 comprises the metal material of layer 210.

In one or more embodiments, the molybdenum silicide film 240 is selectively deposited by atomic layer deposition (ALD), and has a thickness in a range of from about 2 Å to about 10 Å. In some embodiments, the molybdenum silicide film 240 is deposited in a single ALD cycle. In other embodiments, the molybdenum silicide film 240 is deposited in from 1 to 20 ALD cycles. In one or more embodiments, each cycle of the 1 to 20 ALD cycles is configured to deposit a thickness of in a range of from about 0.5 Å to about 4 Å of the molybdenum silicide film 240.

According to one or more embodiments, the substrate is subjected to processing prior to and/or after forming the layer. This processing can be performed in the same chamber or in one or more separate processing chambers. In some embodiments, the substrate is moved from the first chamber to a separate, second chamber for further processing. The substrate can be moved directly from the first chamber to the separate processing chamber, or it can be moved from the first chamber to one or more transfer chambers, and then moved to the separate processing chamber. Accordingly, the processing apparatus may comprise multiple chambers in communication with a transfer station. An apparatus of this sort may be referred to as a "cluster tool" or "clustered system," and the like.

Generally, a cluster tool is a modular system comprising multiple chambers which perform various functions including substrate center-finding and orientation, degassing, annealing, deposition and/or etching. According to one or more embodiments, a cluster tool includes at least a first chamber and a central transfer chamber. The central transfer chamber may house a robot that can shuttle substrates between and among processing chambers and load lock chambers. The transfer chamber is typically maintained at a vacuum condition and provides an intermediate stage for shuttling substrates from one chamber to another and/or to a load lock chamber positioned at the front end of the cluster tool. Any suitable cluster tool known to the skilled artisan may be adapted for the present disclosure. The exact arrangement and combination of chambers may be altered for purposes of performing specific steps of a process as described herein. Other processing chambers which may be used include, but are not limited to, cyclical layer deposition (CLD), atomic layer deposition (ALD), chemical vapor deposition (CVD), physical vapor deposition (PVD), etch, pre-clean, chemical clean, thermal treatment such as RTP, plasma nitridation, degas, orientation, hydroxylation and other substrate processes. By carrying out processes in a chamber on a cluster tool, surface contamination of the substrate with atmospheric impurities can be avoided without oxidation prior to depositing a subsequent film.

According to one or more embodiments, the substrate is continuously under vacuum or "load lock" conditions and is not exposed to ambient air when being moved from one chamber to the next. The transfer chambers are thus under vacuum and are "pumped down" under vacuum pressure. Inert gases may be present in the processing chambers or the transfer chambers. In some embodiments, an inert gas is used as a purge gas to remove some or all of the reactants (e.g., molybdenum- and silicon-containing precursor, silane reactant, etc.). According to one or more embodiments, a purge gas is injected at the exit of the deposition chamber to prevent reactants (e.g., molybdenum- and silicon-containing precursor, silane reactant, etc.) from moving from the deposition chamber to the transfer chamber and/or additional processing chamber. Thus, the flow of inert gas forms a curtain at the exit of the chamber.

The substrate can be processed in single substrate deposition chambers, where a single substrate is loaded, processed and unloaded before another substrate is processed. The substrate can also be processed in a continuous manner, similar to a conveyer system, in which multiple substrate are individually loaded into the first part of the chamber, move through the chamber and are unloaded from a second part of the chamber. The shape of the chamber and associated conveyer system can form a straight path or curved path. Additionally, the processing chamber may be a carousel in which multiple substrates are moved about a central axis and are exposed to deposition, etch, annealing, cleaning, etc. processes throughout the carousel path.

During processing, the substrate can be heated or cooled. Such heating or cooling can be accomplished by any suitable means including, but not limited to, changing the temperature of the substrate support and flowing heated or cooled gases to the substrate surface. In some embodiments, the substrate support includes a heater/cooler which can be controlled to change the substrate temperature conductively. In one or more embodiments, the gases (either reactive gases or inert gases) being employed are heated or cooled to locally change the substrate temperature. In some embodiments, a heater/cooler is positioned within the chamber adjacent to the substrate surface to convectively change the substrate temperature.

The substrate can also be stationary or rotated during processing. A rotating substrate can be rotated (about the substrate axis) continuously or in discrete steps. For example, a substrate may be rotated throughout the entire process, or the substrate can be rotated by a small amount between exposures to different reactive or purge gases. Rotating the substrate during processing (either continuously or in steps) may help produce a more uniform deposition or etch by minimizing the effect of, for example, local variability in gas flow geometries.

The disclosure is now described with reference to the following examples. Before describing several exemplary embodiments of the disclosure, it is to be understood that the disclosure is not limited to the details of construction or process steps set forth in the following description. The disclosure is capable of other embodiments and of being practiced or being carried out in various ways.

EXAMPLES

Example 1. Atomic Layer Deposition of Molybdenum Silicide Films

General procedure: A substrate including a metal and a dielectric was placed in a processing chamber. A molybdenum- and silicon-containing precursor was flowed into the processing chamber in an atmosphere of nitrogen ($N_2$) gas over the substrate leaving a molybdenum-precursor terminated surface. Unreacted precursor and byproducts are then purged out of the chamber. Next, a silane reactant was then introduced into the chamber that reacts with the surface-bound molybdenum species. Again, excess silane reactant and byproducts were removed from the chamber. The resultant material on the substrate was a molybdenum silicide film.

ALD experiments were performed in a Picosun ALD reactor at substrate temperatures between 250° C. to 400° C. Substrates used were $SiO_2$ (300 nm)/Si, W, and Ru. $MoCl_5$ was grounded into a fine powder in an Ar glovebox and was delivered using a heated delivery source at 120° C. Between 700 to 900 mg of $MoCl_5$ was loaded (50-60% excess) to negate any issues related to low precursor consumption at the tail end of the experiments for a set of experiments consisting of a combined total of 2000 to 3000 cycles. ALD experiments consisted of an initial substrate cleaning/chamber saturation stage 10 cycles of the sequence [0.5 s $MoCl_5$|20 s $N_2$ purge] followed by 300 cycles of the sequence [0.5 s $MoCl_5$|20 s $N_2$ purge|0.1 s $Si_3H_8$|10 s $N_2$ purge]. For the "$MoCl_5$-only" experiment, the pulse sequence was [0.5 s $MoCl_5$|20 s $N_2$ purge].

When an ALD experiment conducted with $MoCl_5$ and $Si_3H_8$ at a substrate temperature of 300° C. with 200 cycles, a significant XRF response from the Mo La line was observed only on Ru. Increasing the pulse length of $MoCl_5$ resulted in a decrease of the amount of material deposited, which suggests there is a competitive etching process. Repeating the ALD experiment with higher number of cycles also resulted in the selective deposition on Ru which could rule out a nucleation delay for film growth on $SiO_2$ and W.

ALD experiments with 300 cycles were conducted over several substrate temperatures from 250° C. to 400° C. to identify an ALD window in which deposition occurred. Highest film growth rate on Ru was observed when the substrate temperature was between 300° C. to 325° C. Moreover, deposition on all substrates was observed at substrate temperatures ≥325° C.

X-ray photoelectron spectroscopy (XPS) was conducted on the film deposited on Ru at 300° C. and the depth profile indicated the presence of two distinct film compositions on the substrate. The high film contains high amounts of oxygen during the initial stage of film etching, and it drops drastically as etching approaches the Ru substrate.

Transmission electron microscopy (TEM) of the film deposited on Ru also revealed two distinct growth areas on top of the substrate as was reflected in the XPS depth profile. Based on the visual separation in the TEM images, the two layers measuring about 200 and 800 Å were grown from an ALD experiment with 300 cycles.

Electron energy loss spectroscopy (EELS) performed in conjunction with scanning transmission electron microscopy (STEM) of the film deposited on Ru provided a visual location of elemental composition. A more accurate film composition can be extracted to show a layer of $MoSi_x$ (~100 Å) at the Ru substrate interface, followed by a section of (~100 Å) that is oxygen rich and the rest of the bulk material Mo—Si—O (~800 Å). A line scan of the film stack also provided an atomic composition that complements the EELS color mapping.

Selective deposition on substrates can also be tuned by varying the pulse length of $Si_3H_8$. ALD experiments conducted at 300° C. show that depositions on all substrates can be achieved with a higher pulse length of $Si_3H_8$.

The grazing incidence XRD (GI-XRD) patterns obtained of the films deposited on all substrates at 300° C. indicate the crystalline nature of the film. The same set of reflections was observed on all substrates and there is a strong correlation to indicate that the deposited film is molybdenum disilicide, $MoSi_2$.

SEM of the films deposited at 300° C. showed an approximate film thickness of 145, 145 and 175 nm on $SiO_2$, W, and Ru, respectively. The films are continuous but are visually rough (approximate size 1.0×0.8 cm). Deposited films on W at 300, 350 and 400° C. had film thicknesses of 145, 130 and 55 nm and bulk resistivity measurements that averaged ~739, 1160 and 983 $\mu\Omega$ cm, respectively.

Reference throughout this specification to "one embodiment," "certain embodiments," "one or more embodiments" or "an embodiment" means that a particular feature, structure, material, or characteristic described in connection with the embodiment is included in at least one embodiment of the disclosure. Thus, the appearances of the phrases such as "in one or more embodiments," "in certain embodiments," "in one embodiment" or "in an embodiment" in various places throughout this specification are not necessarily referring to the same embodiment of the disclosure. Furthermore, the particular features, structures, materials, or characteristics may be combined in any suitable manner in one or more embodiments.

Although the disclosure herein has been described with reference to particular embodiments, it is to be understood that these embodiments are merely illustrative of the principles and applications of the present disclosure. It will be apparent to those skilled in the art that various modifications and variations can be made to the method and apparatus of the present disclosure without departing from the spirit and scope of the disclosure. Thus, it is intended that the present disclosure include modifications and variations that are within the scope of the appended claims and their equivalents.

What is claimed is:

1. A method of depositing a film, the method comprising:
exposing a semiconductor substrate surface to a molybdenum- and silicon-containing precursor in a processing chamber, the semiconductor substrate surface comprising at least one feature having at least one opening having a width, at least one sidewall, and a bottom, the at least one feature extending a feature depth from a top surface to the bottom, the bottom comprising a metal material and the at least one sidewall comprising a dielectric material, to deposit a film selectively on the metal material relative to the dielectric material;
purging the processing chamber of the molybdenum- and silicon-containing precursor;
exposing the semiconductor substrate surface to a silane reactant to react with the film to form a molybdenum silicide film on the metal material; and
purging the processing chamber of the silane reactant.

2. The method of claim 1, wherein the molybdenum- and silicon-containing precursor comprises a molybdenum halide.

3. The method of claim 2, wherein the molybdenum- and silicon-containing precursor comprises one or more of molybdenum pentachloride ($MoCl_5$), molybdenum pentafluoride ($MoF_5$), molybdenum trichloride ($MoCl_3$), molybdenum tribromide ($MoBr_3$), and molybdenum hexafluoride ($MoF_6$).

4. The method of claim 1, where the silane reactant comprises one or more of silane ($SiH_4$), disilane ($Si_2H_6$), trisilane ($Si_3H_8$), and alkyl silane.

5. The method of claim 1, wherein the metal material comprises one or more of platinum (Pt), titanium (Ti), titanium nitride (TiN), tantalum nitride (TaN), copper (Cu), cobalt (Cu), tungsten (W), and ruthenium (Ru).

6. The method of claim 1, wherein the dielectric material comprises one or more of silicon (Si), silicon dioxide ($SiO_2$), silicon oxide ($SiO_x$), silicon oxycarbide (SiOC), silicon oxycarbonitride (SiOCN), silicon oxynitride (SiON), and silicon carbonitride (SiCN).

7. The method of claim 1, wherein the molybdenum silicide film is selectively deposited on the metal material and not on the dielectric material.

8. The method of claim 1, wherein the molybdenum silicide film is formed at a temperature in a range of from 100° C. to 500° C.

9. The method of claim 1, further comprising repeating the method to provide a molybdenum silicide film having a thickness of about 5 Å to about 1000 Å.

10. The method of claim 1, wherein the semiconductor substrate surface is exposed to the molybdenum containing precursor and the silane reactant simultaneously.

11. The method of claim 1, wherein the semiconductor substrate surface is exposed to the molybdenum containing precursor and the silane reactant sequentially.

12. A method of depositing a film, the method comprising:
selectively forming a molybdenum silicide film in a process cycle comprising sequential exposure of a semiconductor substrate surface to a molybdenum containing precursor, purge gas, silane reactant, and purge gas, the semiconductor substrate surface comprising at least one feature having at least one opening having a width, at least one sidewall, and a bottom, the at least one feature extending a feature depth from a top surface to the bottom, the bottom comprising a metal material and the at least one sidewall comprising a dielectric material, wherein selectively forming the molybdenum silicide film comprises selectively forming the molybdenum silicide film on the metal material relative to the dielectric material.

13. The method of claim 12, wherein the molybdenum- and silicon-containing precursor comprises a molybdenum halide.

14. The method of claim 13, wherein the molybdenum- and silicon-containing precursor comprises one or more of molybdenum pentachloride ($MoCl_5$), molybdenum pentafluoride ($MoF_5$), molybdenum trichloride ($MoCl_3$), molybdenum tribromide ($MoBr_3$), and molybdenum hexafluoride (MoF6).

15. The method of claim 12, where the silane reactant comprises one or more of silane (SiH4), disilane (Si2H6), trisilane (Si3H8), and alkyl silane.

16. The method of claim 12, wherein the metal material comprises one or more of platinum (Pt), titanium (Ti), titanium nitride (TiN), tantalum nitride (TaN), copper (Cu), cobalt (Cu), tungsten (W), and ruthenium (Ru).

17. The method of claim 12, wherein the dielectric material comprises one or more of silicon (Si), silicon dioxide ($SiO_2$), silicon oxide ($SiO_x$), silicon oxycarbide (SiOC), silicon oxycarbonitride (SiOCN), silicon oxynitride (SiON), and silicon carbonitride (SiCN).

18. The method of claim 12, wherein the molybdenum silicide film is selectively deposited on the metal material and not on the dielectric material.

19. The method of claim 12, wherein the process cycle is maintained at a temperature in a range of from 100° C. to 500° C.

20. The method of claim 12, further comprising repeating the process cycle to provide a molybdenum silicide film having a thickness of about 5 Å to about 1000 Å.

* * * * *